(12) United States Patent
Ku et al.

(10) Patent No.: US 9,545,002 B2
(45) Date of Patent: Jan. 10, 2017

(54) MULTILAYER CIRCUIT BOARD

(71) Applicant: MPI CORPORATION, Zhubei (TW)

(72) Inventors: Wei-Cheng Ku, Zhubei (TW);
Jun-Liang Lai, Zhubei (TW);
Chih-Hao Ho, Zhubei (TW)

(73) Assignee: MPI CORPORATION, Zhubei (TW)

( * ) Notice: Subject to any disclaimer, the term of this patent is extended or adjusted under 35 U.S.C. 154(b) by 3 days.

(21) Appl. No.: 14/619,944

(22) Filed: Feb. 11, 2015

(65) Prior Publication Data
US 2016/0143141 A1    May 19, 2016

(30) Foreign Application Priority Data
Nov. 14, 2014    (TW) .............................. 103139603 A

(51) Int. Cl.
*H05K 1/11*    (2006.01)
(52) U.S. Cl.
CPC .................................... *H05K 1/112* (2013.01)
(58) Field of Classification Search
CPC ...................................................... H05K 1/112
USPC ................................................. 174/265, 262
See application file for complete search history.

(56) References Cited

U.S. PATENT DOCUMENTS

| | | | | |
|---|---|---|---|---|
| 6,024,587 A | * | 2/2000 | Garth | H05K 1/0218 439/101 |
| 7,307,437 B1 | * | 12/2007 | Dobbs | G01R 31/2805 324/750.25 |
| 8,922,234 B2 | * | 12/2014 | Shiraishi | G01R 1/07314 174/251 |
| 2003/0162310 A1 | * | 8/2003 | Nakatuka | G01R 31/2801 438/14 |
| 2010/0289146 A1 | * | 11/2010 | Ramm | H01L 21/76898 257/770 |

FOREIGN PATENT DOCUMENTS

GB    1399006    *    6/1975    .......... H05K 1/0268

* cited by examiner

*Primary Examiner* — Timothy Thompson
*Assistant Examiner* — Charles Pizzuto
(74) *Attorney, Agent, or Firm* — Tracy M. Heims; Apex Juris, PLLC

(57) ABSTRACT

A multilayer circuit board includes a first substrate and a second substrate in stack. The first substrate has a first pad, and a first circuit, wherein the first circuit is embedded in the first substrate, and the first pad is electrically connected to the first circuit. The second substrate has a first through hole, a second pad, and a second circuit, wherein the first through hole is opened at both sides of the second substrate, and the first pad of the first substrate is in the first through hole; the second circuit is embedded in the second substrate, and the second pad is electrically connected to the second circuit. The pads on each substrate are exposed by the through hole(s) of the above substrate(s) to shorten the null sections of the interconnectors and reduce the interference from the null sections.

12 Claims, 6 Drawing Sheets

MULTILAYER CIRCUIT BOARD

BACKGROUND OF THE INVENTION

1. Technical Field

The present invention relates to a circuit board, and more particularly to a multilayer circuit board.

2. Description of Related Art

Printed circuit board (PCB) is widely used in electronic devices. In early days, PCB is a single substrate laminated with a circuit on a side or opposite sides thereof. Now, multilayer PCB is popular in the present market, which has several substrates in stack, and the circuit is embedded therein. FIG. 1 shows a conventional multilayer PCB 300, including several substrates 310 in stack, interconnectors 320 (usually are plated through holes, PTH) to connect circuits 340 of each substrate 310, and pads 330. The pads 330 are provided on an outer surface of the PCB 300, and electrically connected to the interconnectors 320. In order to test the connection of the circuits 340, probes 350 are provided to touch the pads 330. A test signal is transmitted to the circuits 340 from the probes 350 to test the electrical connection.

Typically, the test signal is transmitted in a section of the interconnectors 320, so called functional sections, between the pads 350 and a point where the circuits 340 connect to the interconnectors 320. The other sections of the interconnectors 320, so called null sections 320a, give no function on transmission of the test signal. However, there is a resonance occurred in the null sections 320a while high-frequency signal is transmitted through the null sections 320a, and that will interfere with the signal on the functional sections and result an error in the test.

BRIEF SUMMARY OF THE INVENTION

In view of the above, the primary objective of the present invention is to provide a multilayer circuit board, which may reduce the interference from the null sections of the interconnectors.

In order to achieve the objective of the present invention, a multilayer circuit board includes a first substrate and a second substrate in stack. The first substrate has a first side, a second side, a first pad, and a first circuit, wherein the first side and the second side are on opposite sides of the first substrate; the first pad is on the second side, and electrically connected to the first circuit, which is embedded in the first substrate. The second substrate has a third side, a fourth side, a first through hole, a second pad, and a second circuit, wherein the third side and the fourth side are on opposite sides of the second substrate; the third side of the second substrate is laminated on the second side of the first substrate; the first through hole is opened at both the third side and the fourth side, and the first pad of the first substrate is in the first through hole; the second pad is on the fourth side, and electrically connected the second circuit, which is embedded in the second substrate.

With the design of above, it may shorten the null sections of the interconnectors of the multilayer circuit board to reduce the interference from the null sections of the interconnectors.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
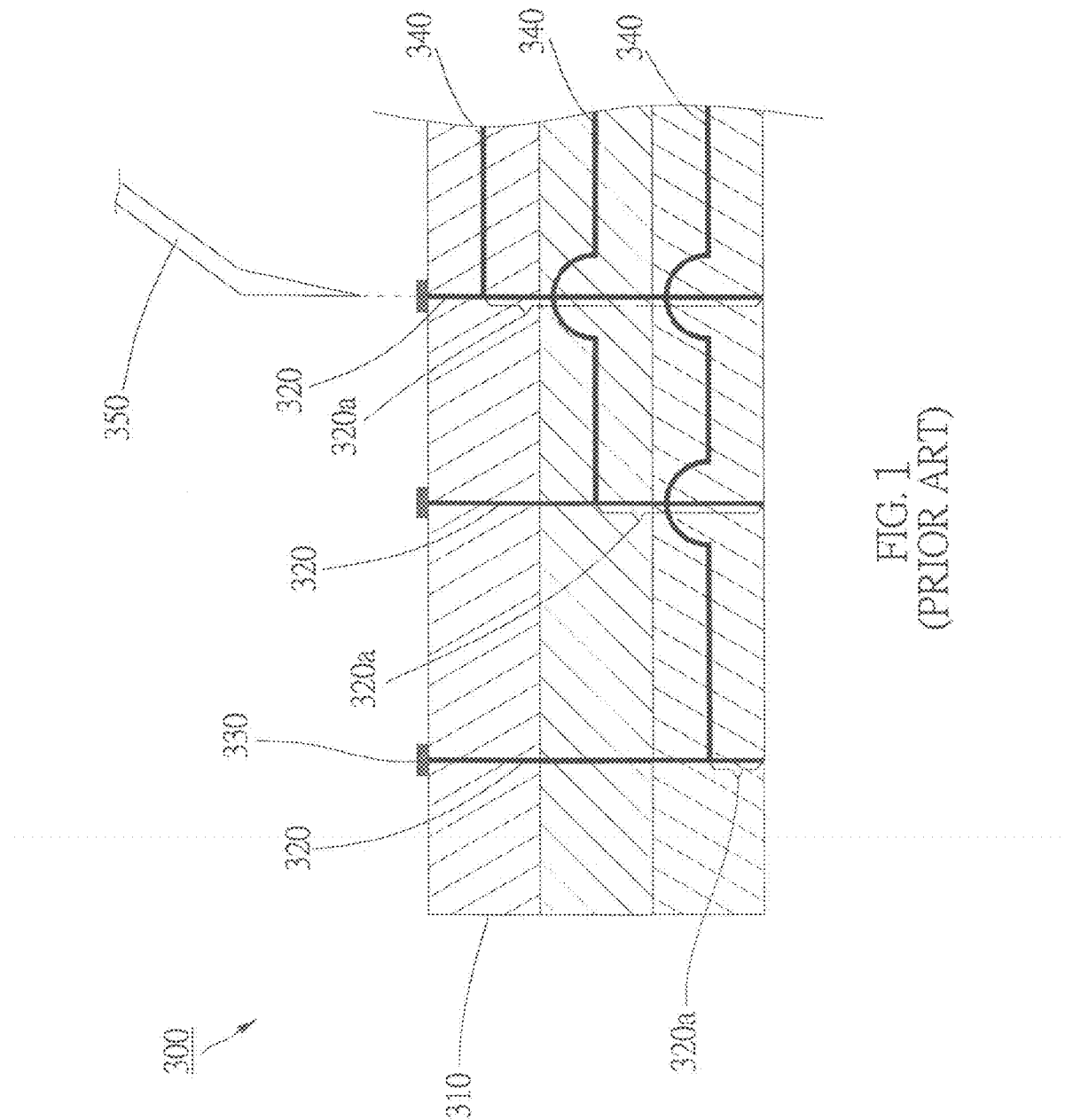
FIG. 1 is a sectional view of the conventional multilayer circuit board.
Figure 2:
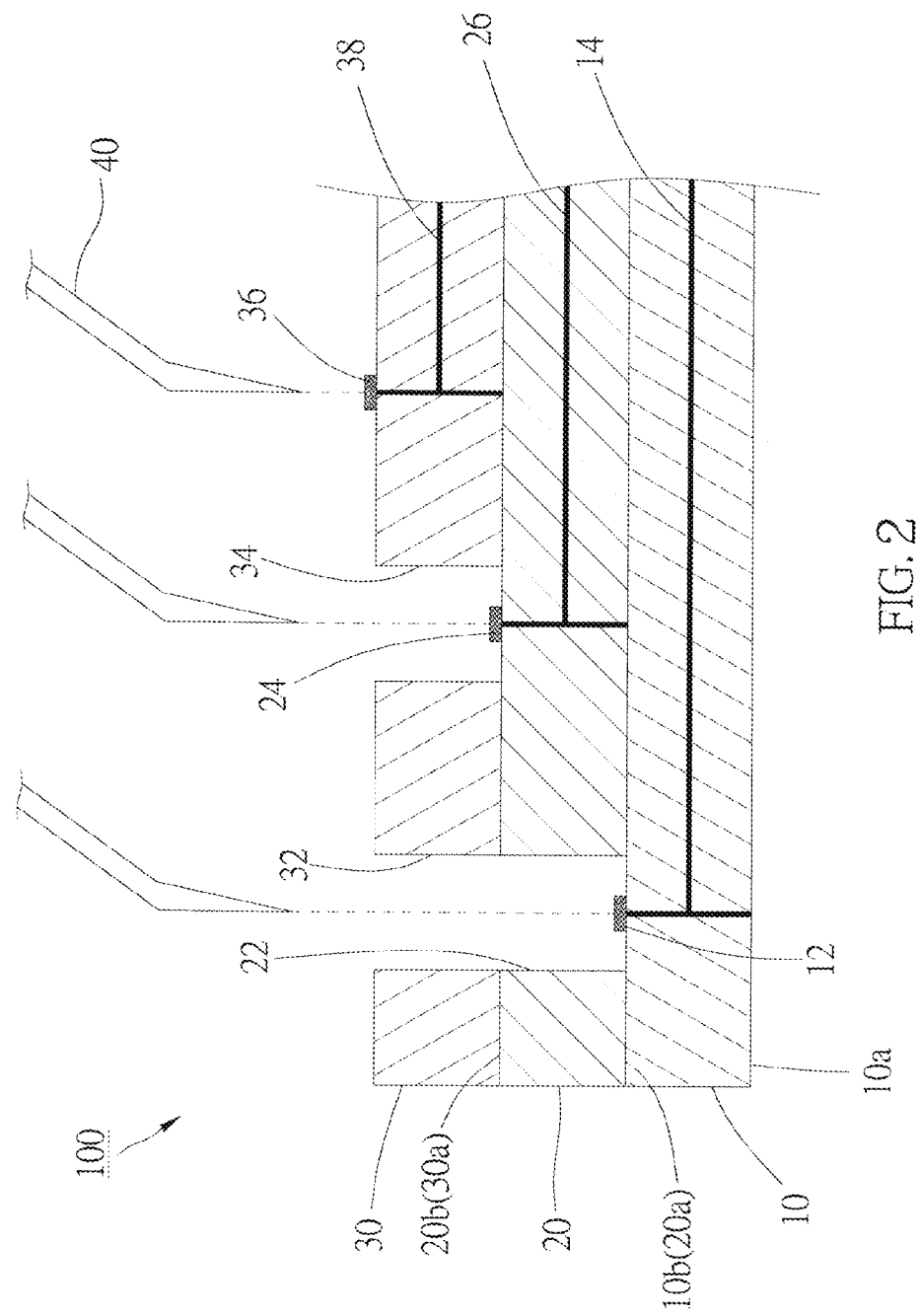
FIG. 2 is a sectional view of a first preferred embodiment of the present invention.
Figure 3:
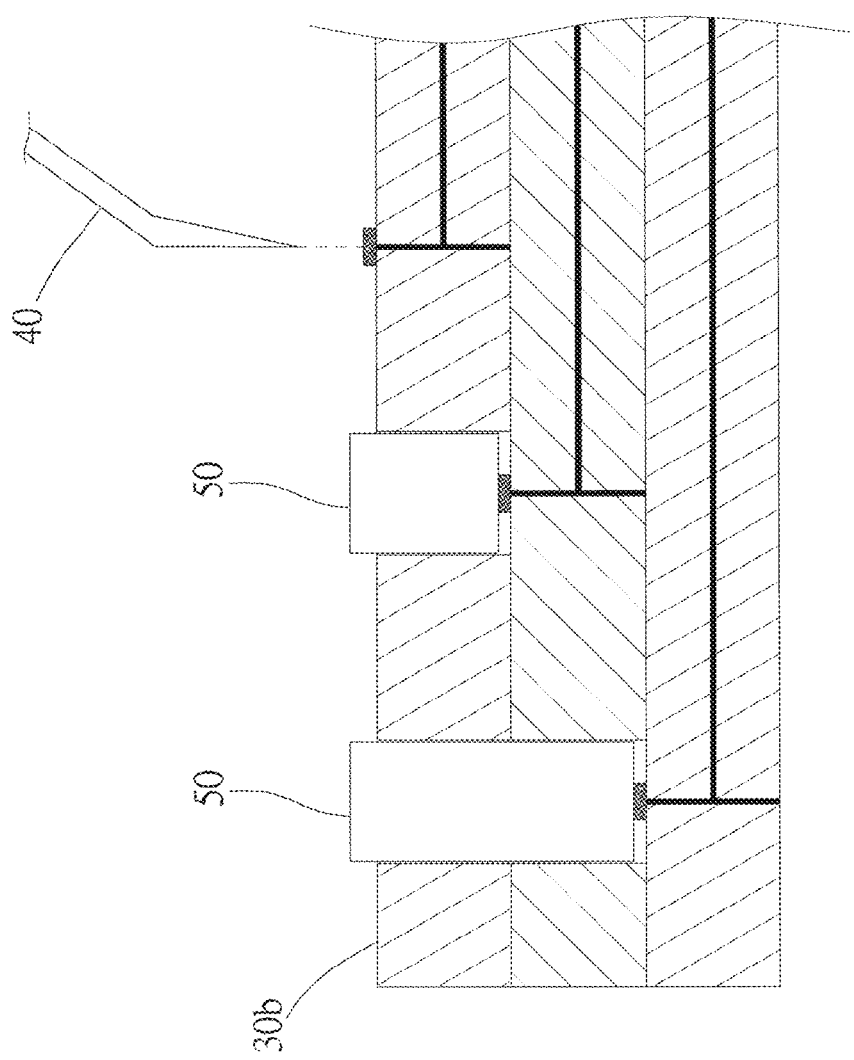
FIG. 3 is a sectional view of the first embodiment of the present invention, showing the first type of the conductor.
Figure 4:
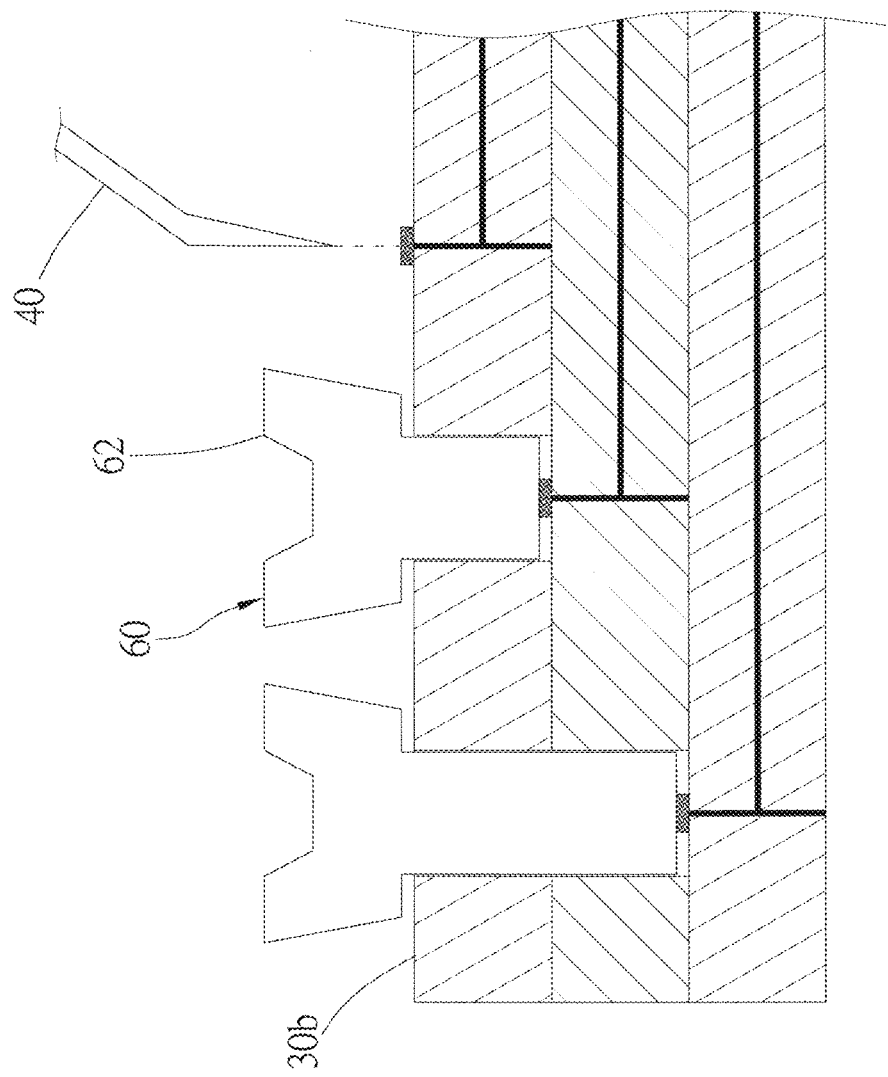
FIG. 4 is a sectional view of the first preferred embodiment of the present invention, showing the second type of the conductor.

As shown in FIG. 2, a multilayer circuit board 100 of the first preferred embodiment of the present invention includes a first substrate 10, a second substrate 20, and a third substrate 30.

The first substrate 10 has a first side 10a, a second side 10b, a first pad 12, and a first circuit 14. The first side 10a and the second side 10b are on opposite sides of the first substrate 10. The first pad 12 is on the second side 10b. The first circuit 14 is embedded in the first substrate 10, and electrically connected to the first pad 12.

The second substrate 20 has a third side 20a, a fourth side 20b, a first through hole 22, a second pad 24, and a second circuit 26. The third side 20a and the fourth side 20b are on opposite sides of the second substrate 20. The third side 20a of the second substrate 20 is laminated on the second side 10b of the first substrate 10. The first through hole 22 is opened at both the third side 20a and the fourth side 20b, and the first pad 12 of the first substrate 10 is right under the first through hole 22. The second pad 24 is on the fourth side 20b, and is electrically connected the second circuit 26 embedded in the second substrate 20.

The third substrate 30 has a fifth side 30a, a sixth side 30b, a second through hole 32, a third through hole 34, a third pad 36, and a third circuit 38. The fifth side 30a and the sixth side 30b are on opposite sides of the third substrate 30. The fifth side 30a of the third substrate 30 is laminated on the fourth side 20b of the second substrate 20. Both the second and the third through holes 32, 34 are opened at both the fifth and the sixth sides 30a, 30b of the third substrate 30. The second through hole 32 is right above the first through hole 22 of the second substrate 20, so that the first pad 12 of the first substrate 10 is exposed through the first and the second through holes 22, 32. The second pad 24 of the second substrate 20 is right under the third through hole 34. The third pad 36 is on the sixth side 30b of the third substrate 30, and electrically connected to the third circuit 38 embedded in the third substrate 30.

With the design of the multilayer circuit board 100 of the first preferred embodiment of the present invention, probes 40 are provided to touch the pads respectively for electrical connection test. It may reduce the interference from the null sections of the interconnectors.

In some circumstances, conductors 50 are provided in the through holes with bottom ends touching the pads while the through holes are too deep for the probes 40 to touch the pads successfully. The conductors 50 are slightly smaller than the through holes in diameter, or the same as the diameter of the through holes, so that the conductors 50 are firmly received in the through holes respectively. In an embodiment, the conductors 50 is longer than the though holes, which means that top ends of the conductors 50 are higher than the sixth side 30b of the third substrate 30.

In an embodiment, each conductor 60 is provided with a recess 62 on a top end thereof to ensure a stable contact of the probe 40 and the connector 60. That is helpful to the correct transmission of the test signal.

Figure 5:
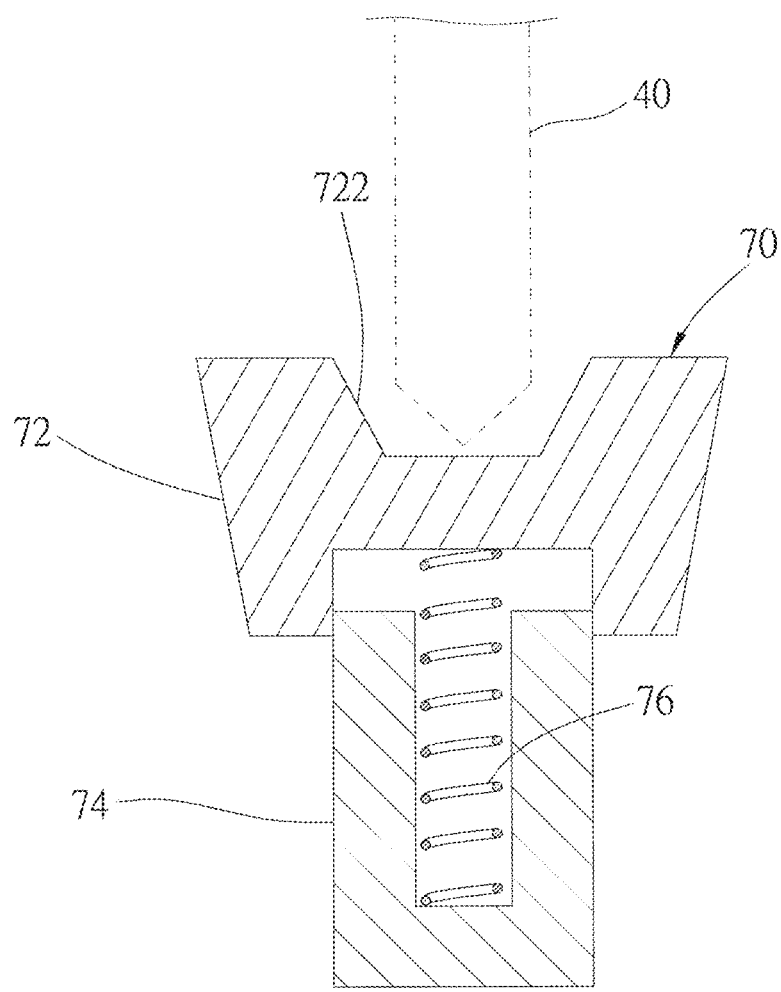
FIG. 5 is a sectional view of the first preferred embodiment of the present invention, showing the third type of the conductor.

The connectors are impacted by the probes when the probes are moved down to touch the connectors. That may damage the connectors or the probes after several times of tests. To fix this problem, as shown in FIG. 5, a connector 70 includes a head 72, a rod 74, and an elastic member, and the elastic member is a spring 76 made of a conductive material in the present embodiment. The rod 74 is received in the through hole to touch the pad thereunder. The rod 74 is provided with a slot on a top end, in which the spring 76 is received. The head 72 has a rim on a bottom end and a recess 722 on a top end thereof. The rim is received in a space between the rod 74 and a sidewall of the through hole, and therefore the head 72 is urged by the spring 76. The spring 76 gives the head 72 a buffer while the probe 60 is touching the head 72 to reduce the impact.

Figure 6:
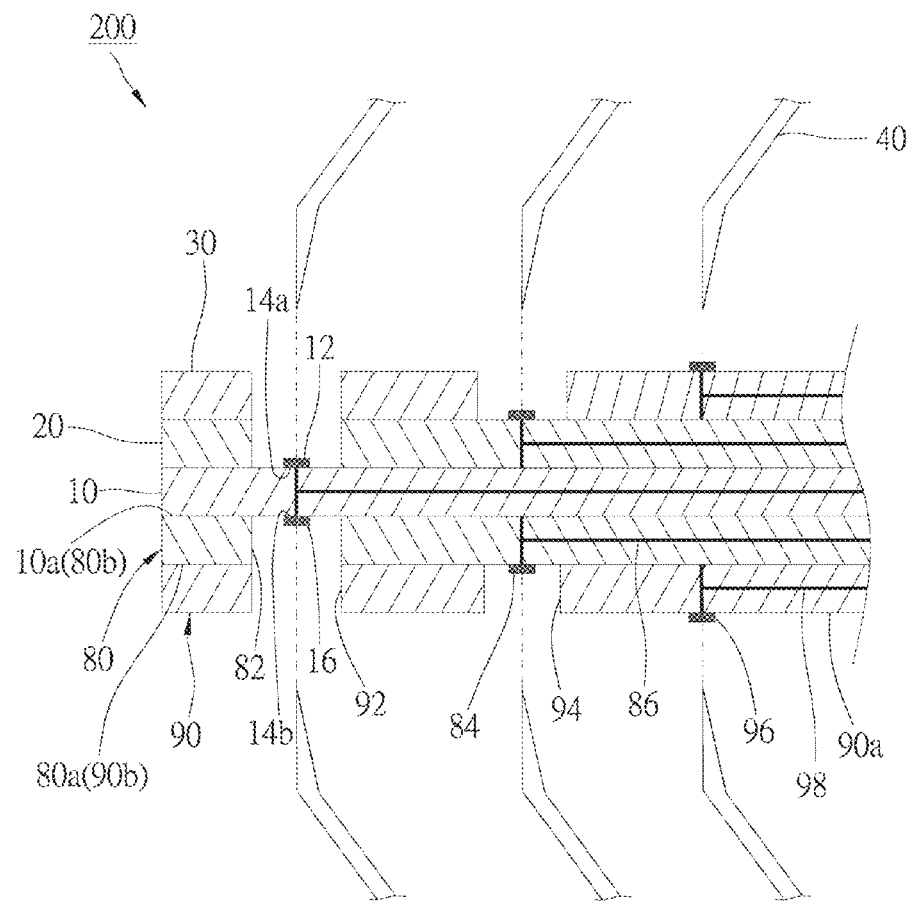
FIG. 6 is a sectional view of a second preferred embodiment of the present invention.

FIG. 6 shows a multilayer circuit board 200 of the second preferred embodiment of the present invention, including the first substrate 10, the second substrate 20, the third substrate 30, which are the same as above, a fourth substrate 80, and a fifth substrate 90. The first substrate 10 further includes a fourth pad 16.

The fourth pad 16 is on the first side 10a of the first substrate 10. The first circuit 14 of the first substrate 10 has a first interconnector 14a and a second interconnector 14b, wherein the first interconnector 14a is electrically connected to the first pad 12, and the second interconnector 14b is electrically connected to the fourth pad 16.

The fourth substrate 80 has a seventh side 80a, an eighth side 80b, a fourth through hole 82, a fifth pad 84, and a fourth circuit 86. The seventh side 80a and the eighth side 80b are on opposite sides of the fourth substrate 80. The eighth side 80b of the fourth substrate 80 is laminated on the first side 10a of the first substrate 10. The fourth through hole 82 is opened at both the seventh side 80a and the eighth side 80b, and the fourth pad 16 of the first substrate 10 is right under the fourth through hole 82. The fifth pad 84 is on the seventh side 80a, and is electrically connected the fourth circuit 86 embedded in the fourth substrate 80.

The fifth substrate 90 has a ninth side 90a, a tenth side 90b, a fifth through hole 92, a sixth through hole 94, a sixth pad 96, and a fifth circuit 98. The ninth side 90a and the tenth side 90b are on opposite sides of the fifth substrate 90. The tenth side 90b of the fifth substrate 90 is laminated on the seventh side 80a of the fourth substrate 80. Both the fifth and the sixth through holes 92, 94 are opened at both the ninth and the tenth sides 90a, 90b of the fifth substrate 90. The fifth through hole 92 is right under the fourth through hole 82 of the fourth substrate 80, so that the fourth pad 16 of the first substrate 10 is exposed through the fourth and the fifth through holes 82, 92. The fifth pad 84 of the fourth substrate 80 is right under the sixth through hole 94. The sixth pad 96 is on the ninth side 90a of the fifth substrate 90, and electrically connected to the fifth circuit 98 embedded in the fifth substrate 90.

With the design of the multilayer circuit board 200 of the second preferred embodiment of the present invention, probes 40 are provided to touch the pads on both side of the multilayer circuit board 200 for electrical connection test. It may reduce the interference from the null sections of the interconnectors.

In conclusion, the multilayer circuit board provides the pads on each substrate, and exposes the pads through the through holes to touch the pads with the probes. The present invention reduces the interference from the null sections of the interconnectors. The present invention also provides the conductors in the through holes to let the probes touch the pads in an easy way.

It must be pointed out that the embodiments described above are only some preferred embodiments of the present invention. All equivalent structures which employ the concepts disclosed in this specification and the appended claims should fall within the scope of the present invention.

What is claimed is:

1. A multilayer circuit board, comprising:
   a first substrate having a first side, a second side, a first pad, and a first circuit, wherein the first side and the second side are on opposite sides of the first substrate; the first pad is on the second side, and electrically connected to the first circuit, which is embedded in the first substrate; and
   a second substrate having a third side, a fourth side, a first through hole, a second pad, and a second circuit, wherein the third side and the fourth side are on opposite sides of the second substrate; the third side of the second substrate is laminated on the second side of the first substrate; the first through hole is opened at both the third side and the fourth side, and the first pad of the first substrate is in the first through hole; the second pad is on the fourth side, and electrically connected the second circuit, which is embedded in the second substrate.

2. The multilayer circuit board of claim 1, further comprising a third substrate having a fifth side, a sixth side, a second through hole, a third through hole, a third pad, and a third circuit; the fifth side and the sixth side are on opposite sides of the third substrate; the fifth side of the third substrate is laminated on the fourth side of the second substrate; both the second through hole and the third through hole are opened at both the fifth side and the sixth side of the third substrate; the second through hole is aligned with the first through hole of the second substrate, so that the first pad of the first substrate is exposed through the first through hole and the second through hole; the second pad of the second substrate is in the third through hole; the third pad is on the sixth side of the third substrate, and electrically connected to the third circuit, which is embedded in the third substrate.

3. The multilayer circuit board of claim 1, further comprising a fourth substrate having a seventh side, an eighth side, a fourth through hole, a fifth pad, and a fourth circuit, wherein first substrate further includes a fourth pad on the first side; the seventh side and the eighth side are on opposite sides of the fourth substrate; the eighth side of the fourth substrate is laminated on the first side of the first substrate; the fourth through hole is opened at both the seventh side and the eighth side, and the fourth pad of the first substrate is in the fourth through hole; the fifth pad is on the seventh side, and electrically connected the fourth circuit, which is embedded in the second substrate.

4. The multilayer circuit board of claim 1, further comprising a conductor received in the first through hole of the second substrate to touch the first pad.

5. The multilayer circuit board of claim 4, wherein the conductor is provided with a recess on a top end thereof.

6. The multilayer circuit board of claim 5, wherein the conductor includes a head, a rod, and an elastic member; the head is provided with the recess on a top end thereof; the rod is received in the first through hole to touch the first pad; and the elastic member has opposite ends urging the head and the rod.

7. The multilayer circuit board of claim 2, further comprising two conductor, one of which is received in the first through hole of the second substrate and the second through hole of the third substrate to touch the first pad, and the other of which is received in the third through hole of the third substrate to touch the second pad.

8. The multilayer circuit board of claim 7, wherein each of the conductors is provided with a recess on a top end thereof.

9. The multilayer circuit board of claim 8, wherein each of the conductors includes a head, a rod, and an elastic member; the head is provided with the recess on a top end thereof; the rod is received in the corresponding through hole to touch the correspond pad; and the elastic member has opposite ends urging the head and the rod.

10. The multilayer circuit board of claim 3, further comprising two conductor, one of which is received in the first through hole of the second substrate to touch the first pad, and the other of which is received in the fourth through hole of the fourth substrate to touch the fourth pad.

11. The multilayer circuit board of claim 10, wherein each of the conductors is provided with a recess on a top end thereof.

12. The multilayer circuit board of claim 11, wherein each of the conductors includes a head, a rod, and an elastic member; the head is provided with the recess on a top end thereof; the rod is received in the corresponding through hole to touch the correspond pad; and the elastic member has opposite ends urging the head and the rod.

\* \* \* \* \*